United States Patent
Brown

(10) Patent No.: US 6,181,626 B1
(45) Date of Patent: Jan. 30, 2001

(54) SELF-TIMING CIRCUIT FOR SEMICONDUCTOR MEMORY DEVICES

(75) Inventor: Jeffrey S. Brown, Fort Collins, CO (US)

(73) Assignee: LSI Logic Corporation, Milpitas, CA (US)

(*) Notice: Under 35 U.S.C. 154(b), the term of this patent shall be extended for 0 days.

(21) Appl. No.: 09/542,078

(22) Filed: Apr. 3, 2000

(51) Int. Cl.[7] .................................................. G11C 7/02
(52) U.S. Cl. ............................................................ 365/210
(58) Field of Search .................................... 365/210, 194

(56) References Cited

U.S. PATENT DOCUMENTS

| | | | |
|---|---|---|---|
| 4,961,166 | * 10/1990 | Sato et al. ............................. | 365/210 |
| 5,414,663 | * 5/1995 | Komarek et al. ..................... | 365/210 |
| 5,596,539 | 1/1997 | Passow et al. ........................ | 365/210 |
| 5,596,545 | 1/1997 | Lin ........................................ | 365/236 |
| 5,761,143 | 6/1998 | Fukuda ................................. | 365/210 |
| 5,793,671 | * 8/1998 | Selcuk .................................. | 365/210 |
| 5,903,305 | 5/1999 | Wik et al. ............................. | 365/222 |
| 5,999,482 | 12/1999 | Kornachuk et al. ................. | 365/233 |
| 6,002,858 | 12/1999 | Bernard ............................ | 395/500.15 |
| 6,009,040 | 12/1999 | Choi et al. ............................ | 365/233 |

\* cited by examiner

Primary Examiner—Trong Phan
(74) Attorney, Agent, or Firm—David Brush, Esq.; Westman, Champlin & Kelly

(57) ABSTRACT

A self-timing circuit with bit cell leakage current compensation provides a worst-case delay for a sense application read of a memory core. The self-timing memory circuit includes a worst-case dummy bit cell, a column of leakage current simulating dummy bit cells, and a dummy sense amplifier. The worst-case dummy bit cell is occupied to a dummy word line and a dummy bit line and is configured to drive the dummy bit line or dummy bit line pair to a first differential state when the dummy word line is asserted. The column of leakage current simulating dummy bit cells are coupled to the dummy tit line and are configured to delay the driving of the dummy bit line to the first differential state due to leakage current between the leakage current simulating dummy bit cells and the dummy bit line or bit line pair. The dummy sense amplifier is coupled to the dummy bit line or bit line pair and is configured to generate the timing control signal, which can be used to control a sense amplification read, when the first differential state is detected.

17 Claims, 2 Drawing Sheets

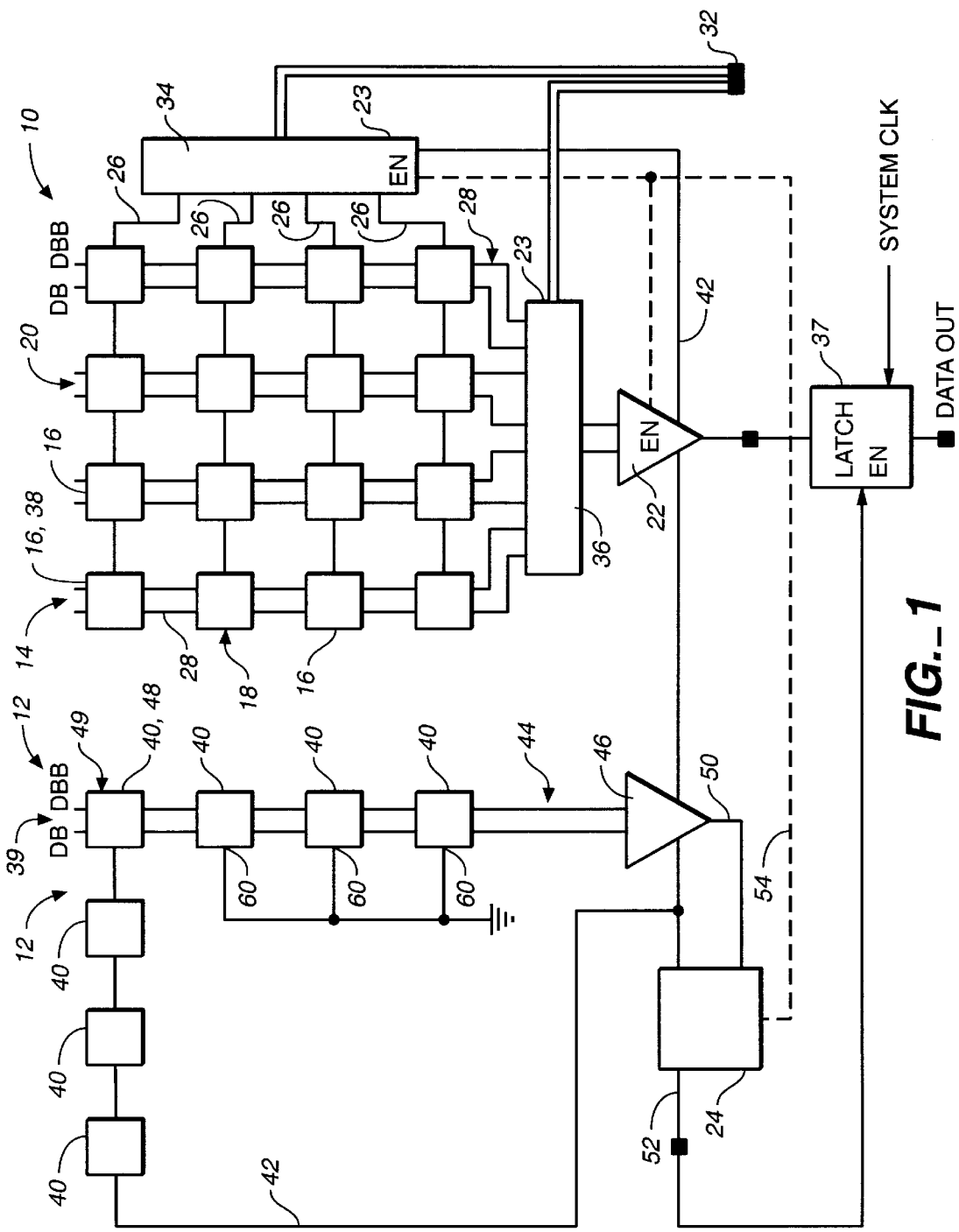
FIG._1

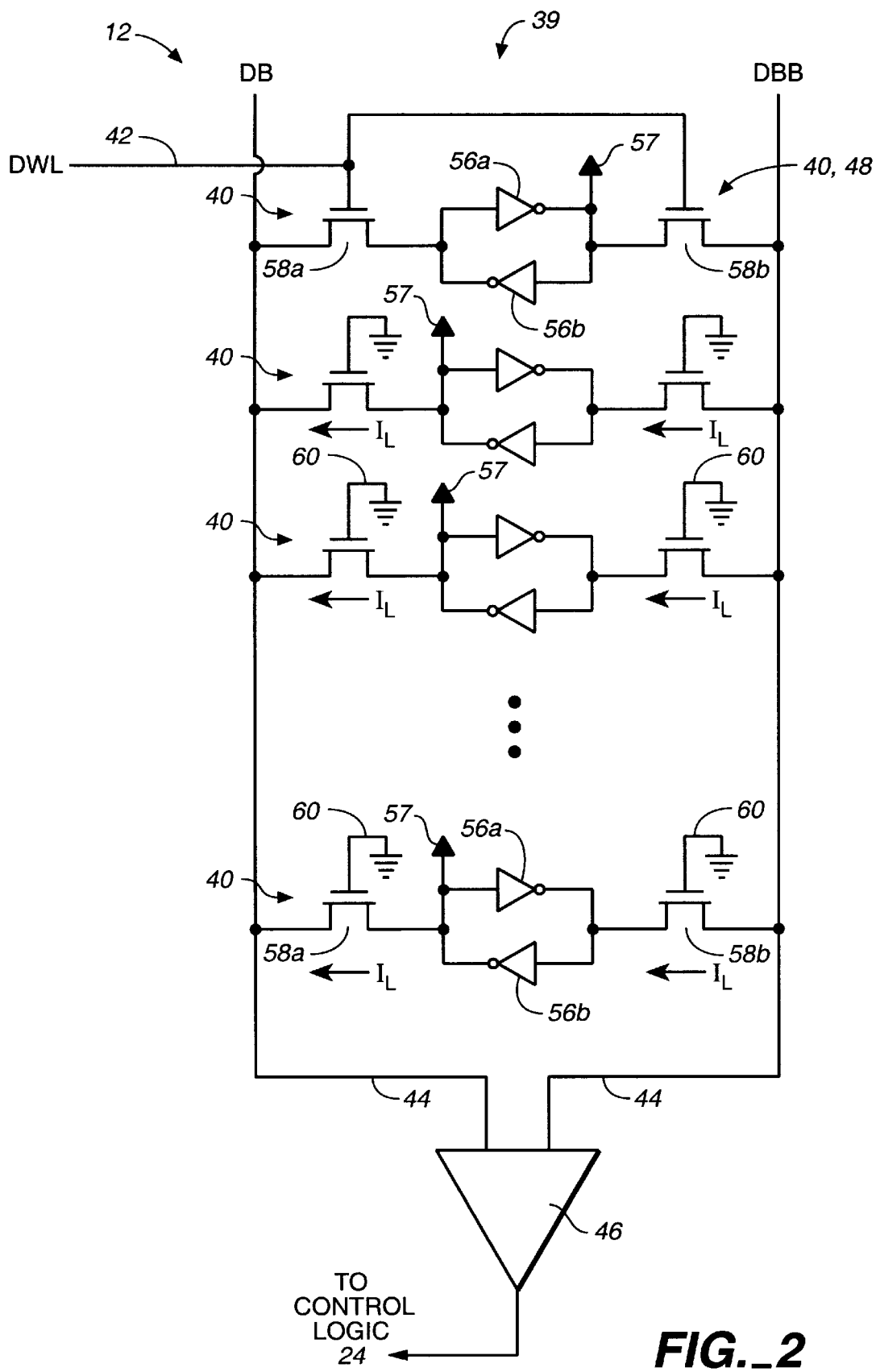
FIG._2

SELF-TIMING CIRCUIT FOR SEMICONDUCTOR MEMORY DEVICES

BACKGROUND OF THE INVENTION

The present invention relates to semiconductor memory devices, and more particularly, to a method and apparatus for improved memory self-timing.

Memory devices typically include a memory core having an array of memory cells for storage and retrieval of data. The array of memory cells are arranged in rows and columns. The rows of memory cells are coupled through word lines and the columns of memory cells are coupled through bit lines. Each column can have a single bit line (for single-ended memory cells) or a complementary bit line pair (for dual-ended memory cells). Although many architectures are possible, a row or word line decoder including a plurality of word line drivers and a column decoder are provided for decoding an address for accessing a particular location of the memory array. Sense amplifiers are enabled to sense the data from the memory cells in the array on the bit lines or bit line pairs. The sense amplifiers output the data to latches which latch the data.

The latching of the data must be delayed for a period of time after the access cycle commences to ensure that the data from the sense amplifiers is valid. Part of the delay is the result of RC delay in the word lines due to the capacitance of the memory cells that are electrically coupled to the word lines in each row. Similarly, RC delay is also produced in the columns of the memory core due to the capacitance of the memory cells that are electrically coupled to the bit lines in each column. Thus, each access to a particular memory cell includes a delay between the assertion of the word line corresponding to the memory cell and the activation of the memory cell, and a delay between the activation of the memory cell and the discharge of the bit line or bit line pair to which it is connected. The data from the sense amplifiers is not valid until after these delays have expired Consequently, it is desirable to provide timing control to prevent the latching of the data from the sense amplifiers prior to the expiration of an appropriate delay, generally a worst-case delay, to ensure that the data being latched is valid. The worst-case RC delay is generally associated with a worst-case memory cell that is located furthest from a given word line driver and a given sense amplifier.

Additionally, the sense amplifiers consume an appreciable amount of power while activated. As result, it is also desirable to provide timing control that deactivates (shuts down) the data sense amplifiers as soon as possible after the data has been latched.

Various methods are known for providing the desired timing control for the data sense amplifiers, including self-timing circuitry. Self-timing circuitry is used in conventional memory designs to provide a timing control signal that indicates when data from the sense amplifiers of the memory core should be latched and when the sense amplifiers can be deactivated. The self-timing circuitry is intended to provide a delay that at least meets the worst-case RC delay of the memory core.

One type of self-timing architecture involves simulating the worst-case RC delay by reproducing the longest path of the memory core. Here, the self-timing circuit generally includes a column Of dummy bit cells coupled to a dummy sense amplifier through a dummy bit line pair (or a single bit line for single-ended bit cells). The column of dummy bit cells includes a worst-case dummy bit cell that is coupled to a dummy word line driver of the word line decoder of the memory core. The remaining dummy bit cells are not coupled to a word line and do not assert data on the dummy bit line pair. Instead, the remaining dummy bit cells are used to simulate the RC delay that exists in a column of the memory core. Similarly, a row of dummy bitcells can be coupled to the dummy word line to provide additional RC delay that relates to the RC delay produced by a row of the memory core. The worst-case dummy bit cell is preferably positioned similarly to the worst-case memory cell of the memory core.

The word line decoder of the memory device typically includes a dummy word line driver, which receives a word line enable signal from control logic during every access cycle, and correspondingly asserts the dummy word line. The assertion of the dummy word line causes a memory read access to occur in the self-timing circuitry simultaneously with each access of the memory core. The worst-case dummy bit cell is configured to assert predetermined complementary logic levels on the dummy bit line pair. The dummy sense amplifier senses the predetermined complementary logic levels asserted by the worst-case dummy bit cell and responds by asserting a timing control signal. Control logic detects the assertion of the timing control signal and responds by asserting latch signals to the latches of the memory core, which latch the output data from the sense amplifiers. Additionally, the control logic, in response to the timing control signal, can deassert word line enable and sense enable signals to shut down the word line decoder and the sense amplifiers, respectively, to prevent further power drain in the memory array. In this manner, the output data is latched and the sense amplifiers are shut down as soon as possible to conserve energy, but not prior to the worst-case RC delay in an effort to ensure that only valid data is latched. As a result, a worst-case RC delay associated with the RC delays corresponding to the rows and columns of the memory core can be taken into account with the above-described self-timing scheme.

Unfortunately, the RC delays of the memory core are not the only sources of delay that exist in a conventional memory device. Current leaking from pass gates of the memory core cells to the bit line or bit line pair can hinder the driving of the bit line or bit line pair to the state or logic level that represents the data of the memory cell being accessed, thereby introducing additional delay. This delay is defined as leakage current delay. This leakage current delay can result in a greater worst-case delay for the memory array than the worst-case RC delay estimated by conventional self-timing schemes. As a result, conventional self-timing schemes can result in an underestimation of the worst-case delay for a given memory core. Consequently, invalid data can be latched and sense amplifiers can be shut down prematurely due to the underestimation of the worst-case delay.

SUMMARY OF THE INVENTION

A self-timing circuit with bit cell leakage current compensation is provided that generates a timing control signal for a sense application read of a semiconductor memory device. The self-timing memory circuit includes a worst-case dummy bit cell, a column of leakage current simulating dummy bit cells, and a dummy sense amplifier. The worst-case dummy bit cell is coupled to a dummy word line and a dummy bit line or a dummy bit line pair and is configured to drive the dummy bit line or dummy bit line pair to a first differential state when the dummy word line is asserted. The column of leakage current simulating dummy bit cells are coupled to the dummy bit line or bit line pair and are configured to hinder the driving of the dummy bit line or bit line pair to the first differential state due to leakage current between the leakage current simulating dummy bit cells and the dummy bit line or bit line pair. The dummy sense amplifier is coupled to the dummy bit line or bit line pair and is configured to generate the timing control signal when the first differential state is detected. The timing control signal can be used by control logic to provide latch enable signals to latches of the memory core to latch data, and also to deactivate sense amplifiers of the memory core.

Another aspect of the invention is directed toward a method for providing leakage current compensation in a self-timing memory circuit. Method includes biasing a worst-case dummy bit cell to drive a dummy bit line or dummy bit line pair to a first differential state when a dummy word line is asserted; biasing a column of leakage current simulating dummy bit cells to delay the driving of the dummy bit line or dummy bit line pair due to leakage current between the leakage current simulating dummy bit cells and the dummy bit line or dummy bit line pair; detecting the first differential state; and providing a timing control signal for a sense amplification read of a memory core when the first differential state is detected.

Yet another aspect of the invention is directed toward a memory device. The memory device includes a memory core and the self-timing circuitry described above. The memory core includes a memory cell array, address decoding circuitry, and at least one sense amplifier configured to perform a sense amplification read, and control logic. The self-timing circuitry generates a timing control signal which is used by the control logic to control the timing of the sense amplification read.

A further aspect of the invention is directed toward a compiler that is configured to form the above-described memory device.

BRIEF DESCRIPTION OF THE DRAWINGS

FIG. 1 is a simplified schematic of a memory device in accordance with various embodiments of the invention.

FIG. 2 is a simplified schematic of a self-timing circuit in accordance with one embodiment of the invention.

DETAILED DESCRIPTION OF ILLUSTRATIVE EMBODIMENTS

The present invention provides a self-timing circuit to provide sense amplification timing for a semiconductor memory device. The self-timing circuit of the present invention provides a worst-case delay to compensate for RC delay associated with the memory core and delay related to leakage current from memory cells of the memory core, during each read cycle. A timing control signal is generated by the self-timing circuit to indicate the expiration of the worst-case delay. The timing control signal can be used by control logic of the memory core to trigger latches to latch data sensed by sense amplifiers of the memory core. Also, the timing control signal can be used to disable the sense amplifiers of the memory core, once the data has been latched, to reduce power dissipation in the memory core.

FIG. 1 shows an example of a semiconductor memory device 10 which includes a self-timing circuit, generally designated as 12, in accordance with one embodiment of the invention. Self-timing circuitry 12 provides sense amplification timing for memory core 14. Memory core 14 includes an array of memory cells 16 arranged in rows 18 and columns 20, at least one sense amplifier 22, address decoding circuitry 23, and control logic 24. To simplify the discussion of the invention, the example of memory core 14 shown in FIG. 1 includes a four-by-four array of memory cells 16. However, one skilled in the art will appreciate that the array could be much larger. Memory cells 16 are depicted in FIG. 1 as dual-ended bit cells. Each row 18 of memory cells 16 is electrically coupled to a respective word line 26, and each column 20 of memory cells 16 is electrically coupled to a respective bit line pair 28. Each bit line pair 28 includes complementary bit lines DB and DBB, as is common in the industry. Alternatively, memory cells 16 can be single-ended bit cells (not shown) where each column 20 of memory cells 16 is electrically coupled to a single bit line.

Each bit line DB and DDB of bit line pair 28 is precharged to a predetermined level, preferably high.

Memory cells 16 can each have one of two complementary logic states depending on the data stored therein. For the dual-ended arrangement shown in FIG. 1, when one of the word lines 26 is asserted, the memory cells 16 connected to that word line 26 drive one of the corresponding bit lines D3 and DBB low, while leaving the other of the bit lines B d DBB high, depending on data stored in the memory cells 16.

Decoding circuitry 23 is configured to decode an address received from memory address inputs 32 that relates to a particular memory cell 16 that is to be accessed during a given read cycle. In the example shown in FIG. 1, decoding circuitry 23 includes word line decoder 34 and column multiplexer 36. Word line decoder 34 asserts the word line 26 corresponding to the row 18 that is to be accessed using internal word line drivers (not shown). Column multiplexer 36 links sense amplifier 22 to the particular column 20 that is to be accessed. Column multiplexer 36 is used to reduce the number of sense amplifiers 22 that are required in memory core 14. As a result, column multiplexer 36 could be eliminated by coupling each bit line pair 28 to a sense amplifier 22.

During each read access cycle, a word line 26 is asserted and the memory cell 16 coupled to the asserted word line 26 drives its data onto bit line pair 28 by discharging one of the bit lines DB or DBB. Sense amplifier 22 senses, through column multiplexer 36, a differential state between bit lines DB and DBB corresponding to the accessed memory cell 16 and provides a data output relating to the logic state of the memory cell 16 being accessed. Control logic 24 enables latch 37, to latch the data output from sense amplifier 22 to complete the read cycle.

The described read access cycle does not occur instantaneously. Instead, RC delays are introduced in word line 26 and bit line pair 28 as a result of the connected memory cells 16. Thus, there is a word line RC delay associated with word lines 26 and a bit line RC delay associated with bit line pairs 28. The word line RC delay causes a period of time to elapse between the assertion of a word line 26 by a word line driver and the actual activation of memory cells 16 that are coupled to the word line 26. The memory cell 16 located furthest from the word line driver, or at the end of row 18 that is opposite word line decoder 16, generally represents the memory cell 16 having the worst-case word line RC delay. Similarly, the bit line RC delay causes a period of time to elapse between the discharging of one of the bit lines DB or DBB once a memory cell 16 is activated and the sensing of the differential state between the bit lines DB and DBB that is representative of the data stored in the memory cell 16 by sense amplifier 22. The memory cell 16 located furthest from sense amplifier 22, or at the end of column 20 that is opposite sense amplifier 22, generally represents the memory cell 16 having the worst-case bit line RC delay. The memory cell 16 that represents both the worst-case word line RC delay and the worst-case bit line RC delay, represents the worst-case memory cell 16. Therefore, in the example shown in FIG. 1. memory cell 38 represents the worst-case memory cell of memory core 14.

Another source of delay is produced in columns 20 of memory core 14 due to current leaking through the pass gates of memory cells 16 that are electrically coupled to the same bit line pair 28 as the memory cell being accessed. As will be discussed further below, current will generally leak through the pass gates of the memory cells 16 that are in the same column 20 of the memory cell 16 being accessed during the read cycles, and which are storing data representing a logic state that is opposite that of the memory cell 16 being accessed. This delay is defined as leakage current delay. The leakage current delay hinders the driving of the bit lines DB and DBB toward the differential state that represents the data stored in the memory cell 16 that is being accessed. The leakage current delay is maximized, or becomes a worst-case leakage current delay, when all of the other memory cells 16 in a column 20 are storing data that is opposite to the data stored by the accessed memory cell 16. As a result, data from sense amplifier 22 of memory core 14 should not be latched until after a worst-case delay defined as including the worst-case word line RC delay the worst-case bit line RC delay, and a worst-case leakage current delay of the memory core 14, to ensure that the data being latched is valid.

Self-timing circuit 12 simulates the worst-case delay of memory core 14 and generates a timing control signal when the worst-case delay has expired As a result, the timing control signal can be used by control logic 24 to control the latching of valid output data from sense amplifier 22 and the disabling of sense amplifier 22. In accordance with one embodiment of the invention, self-timing circuit 12 includes a dummy column 39 of dummy bitcells 40, a dummy word line 42, dummy bit line pair 44, and a dummy sense amplifier 46. Dummy bit cells 40 are dual-ended bit cells, preferably the same as memory cells 16 of memory core 14, which couple to dummy sense amplifier 46 through dummy bit line pair 44. Alternatively, dummy bit cells 40 can also be single-ended dummy bit cells (not shown) in the case where memory cells 16 of memory core 14 are single-ended bit cells. Dummy column 39 includes worst-case dummy bit cell 48 which is coupled to dummy word line 42. The remaining dummy bit cells 40 in dummy column 39 are leakage current simulating bit cells that are used to simulate the worst-case leakage current delay of memory core 14, as discussed in greater detail below. Dummy column 39 is configured to simulate a column 20 of memory core 14 and, thus, the worst-case bit line RC delay of memory core 14 occurs at worst-case dummy bit cell 48. Another embodiment of self-timing circuit 12 includes dummy row 49 which simulates a row 18 of memory core 14 and, thus, the worst-case word line RC delay of memory core 14 occurs at worst-case dummy bit cell 48. Dummy word line 42 is coupled to word line decoder 34, which can assert dummy word line 42 simultaneously with the assertion of a word line 26, during each access to memory core 14, using a dummy word line driver (not shown). Worst-case dummy bit cell 48 drives its data onto dummy bit line pair 44 by discharging one of the dummy bit lines DB and DBB. When dummy sense amplifier 46 detects a first threshold state corresponding to the data stored in worst-case dummy bit cell 48, dummy sense amplifier 46 produces a timing control signal at output 50 after the worst-case delay of memory core 14 has expired.

Control logic 24 detects the assertion of dummy word line 42 and the timing control signal after the worst-case delay has expired. Control logic 24 can respond to the timing control signal in several ways. In one embodiment, control logic 24 responds by asserting a latch enable signal at output 52 to latch 37 of memory core 14 which latches the output data from sense amplifier 22. Here, the timing control signal is used to indicate when the data being sensed by sense amplifier 22 is valid. In another embodiment, control logic 24 responds to the timing control signal by deasserting word line enable and sense enable signals through output 54, which shuts down sense amplifier 22 and word line decoder 34 to prevent further power drain in memory device 10. In yet another embodiment control logic 24 first asserts the latch enable signal to latch the data from sense amplifier 22, then deasserts the word line enable and sense enable signals. Thus, the output data is latched and sense amplifier 22 is shut down as soon as possible to conserve energy, but not prior to the worst-case delay associated with memory core 14 to ensure that only valid data is latched.

FIG. 2 is a schematic diagram, which shows an embodiment of dummy column 39 of self-timing circuit 12 in greater detail. In this example, each dual-ended dummy bit cell 40 of dummy column 39 (or memory cell 16 of memory core 14) includes a memory element formed by a pair of back-to-back inverters 56a and 56b a pair of pass gates 58a and 58b, which couple the memory element to dummy bit line pair 44. The output of each inverter 56a and 56b is coupled to the input of the other inverter 56a and 56b in the memory cell. Pass gate 58a is coupled between the output of inverter 56b and bit line DB, while pass gate 58b is coupled between the output of inverter 56a and bit line DBB. In this embodiment, pass gates 58a and 58b are implemented with series connected n-channel transistors.

For worst-case dummy bit cell 48, the input of inverter 56b is coupled to a logic high level 57 to simulate data representing, for example; a logic "0". The gates of pass gates 58a and 58b in worst-case dummy bit cell 48 are coupled to dummy word line 42. When dummy word line 42 asserted., pass gates 58a and 58b turn on and worst-case dummy bit cell 48 discharges bit line DB to a logic low level through pass gate 58a.

In contrast, the remaining dummy bit cells 40 in column 39 or the leakage current dummy bit cells, are biased to simulate data having the opposite state as worst-case dummy bit cell 48 In these cells, the input at inverter 56a is coupled to a logic high level 57 to simulate data representing, for example a logic "1". However, the gates of pass gates 58a and 58b in the leakage current dummy bit cells 40 are tied to a logic low level 60 such that these pass gates remain off, thus preventing them from driving their data onto dummy bit line pair 44. Although the leakage current simulating dummy bit cells 40 in column 39 are off, these cells can introduce leakage current $I_L$ into bit lines DB and DBB.

As mentioned above, leakage current simulating dummy bit cells 40 simulate the worst-case leakage current of memory core 14. The leakage current delay is simulated by maximizing the potential for leakage between the leakage current simulating dummy bit cells 40 and dummy bit line pair 44 (DB and DBB) when worst-case dummy bit cell 48 drives its data onto dummy bit line pair 44. This is accomplished by setting the data of all of the leakage current simulating dummy bit cells 40 to a predetermined logic state that is opposite that of the worst-case dummy bit cell 48. In other words, if worst-case dummy bit cell 48 is storing a logic state representing a logic "1", leakaqe current simulating dummy bit cells 40 will have a logic state of "0", and vice versa. As a result, when dummy word line 42 is asserted, worst-case dummy bit cell 48 drives bit line pair 44 toward a first differential by discharging one of the dummy bit lines DB and DDB low. In the example shown in FIG. 2, worst-case dummy bit cell 48 will drive dummy bit line DB low. Leakage current simulating dummy bit cells 40 produce leakage currents $I_L$ due to a voltage drop across pass gates 58a and 58b. Leakage currents $I_L$ will hinder or delay the driving of bit line pair 44 toward the first differential state by slowing the dropping of bit line DB from the precharged high level to the low level. Similarly, leakage currents $I_L$ will reduce the level of bit line DBB from its precharged high level. As a result, leakage currents $I_L$, will delay the development of the first differential state on bit line pair 44. This delay is similar to the worst-case leakage current delay that could be produced by memory core 14. When dummy sense amplifier 46 detects the first differential state it responds by producing the timing control signal, which can be used by control logic 24 to control the sense amplification read of memory core 14, as described above.

Therefore, self-timing circuit 12 generates the timing control signal, after the commencing of a memory access read, by a period of time equal to the worst-case delay of memory core 14. The worst-case delay includes the worst-case bit line RC delay and the worst-case leakage current delay associated with memory core 14. Additional embodiments of self-timing circuit 12 include, in the delay produced by self-timing circuit 12, the worst-case word line RC delay of memory core 14. Control logic 24 uses the timing control signal to ensure that the data being sensed by sense amplifier 22 is valid.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of structure and arrangement of parts within the principles of the present invention to the full extent indicated by the broad general meaning of the terms in which the appended claims are expressed. For example, it should be understood that the embodiments of the present invention are applicable to other memory devices or circuits and other memory cells. Thus, the embodiments of the present invention may be applied to any number of memory circuits, such as ROM memory circuits. RAM memory circuits, DRAM memory circuits, EPROM memory circuits, EEPROM memory circuits, etc., without departing from the spirit and scope of the present invention. Additionally, embodiments of the present invention can be applied to memory devices using various types of either dual-ended or single-ended memory cells. Other modifications can also be made.

What is claimed is:

1. A self-timing memory circuit with bitcell leakage current compensation comprising:
    a worst-case dummy bit cell electrically coupled to a dummy word line and at least one dummy bit line and configured to drive the dummy bit line to a first differential state when the dummy word line is asserted;
    a column of leakage current simulating dummy bit cells each electrically coupled to the dummy bit line and configured to delay the driving of the dummy bit line to the first differential state due to leakage current between the leakage current simulating dummy bitcells and the dummy bit line pair; and
    a dummy sense amplifier coupled to the dummy bit line and configured provide a timing control signal, whereby the timing control signal is used to control a sense amplification read of a memory core.

2. The self-timing memory circuit of claim 1, wherein:
    the worst-case dummy bitcell is set to a first logic level; and
    the leakage current simulating dummy bitcells are each set to a second logic level that is opposite the first level.

3. The self-timing memory circuit of claim 1, wherein the column of leakage current simulating dummy bitcells and the worst-case dummy bitcell form a dummy column that simulates a column of the memory core.

4. The self-timing memory circuit of claim 3, wherein:
    the dummy column includes first and second ends;
    the worst-case dummy bitcell is at the first end; and
    the dummy sense amplifier is at the second end.

5. The self-timing memory circuit of claim 1, further comprising a row of dummy bitcells electrically coupled to the dummy word line to simulate a row of the memory core.

6. The self-timing memory circuit of claim 1, wherein the timing control signal is used to perform at least one of latching data and shutting down at least one sense amplifier of the memory core.

7. The self-timing memory circuit of claim 1, wherein the worst-case dummy bit cell and the leakage current simulating dummy bit cells are selected from the group consisting of single-ended bit cells and dual-ended bit cells.

8. A memory device comprising:
    a memory core including:
        a memory array having rows and columns of memory cells coupled to word lines and at least one bit line, respectively;
        at least one sense amplifier configured to perform a sense amplification read on the bit line and produce a data output;
        a decoding circuit configured to decode an address relating to a particular memory cell, assert the word line corresponding to the particular memory cell, and assert a dummy word line; and
        control logic for controlling the sense amplification read; and
    self-timing circuit comprising:
        a worst-case dummy bitcell electrically coupled to the dummy word line and at least one dummy bit line and configured to drive the dummy bit line to a first differential state when the dummy word line is asserted;
        a column of leakage current simulating dummy bitcells each electrically coupled to the dummy bit line and configured to delay the driving of the dummy bit line to the first differential state due to leakage current between the leakage current simulating dummy bitcells and the dummy bit line; and
        a dummy sense amplifier coupled to the dummy bit line and configured generate a timing control signal when the first differential state is detected, wherein the control logic uses the timing control signal to control the timing of the sense amplification read.

9. The memory device of claim 8, wherein:
    the worst-case dummy bitcell is set to a first logic level; and
    the leakage current simulating dummy bitcells are each set to a second logic level that is opposite the first level.

10. The memory device of claim 8, wherein the column of leakage current simulating dummy bitcells and the worst-case dummy bitcell form a dummy column that simulates a column of the memory array.

11. The memory device of claim 10, wherein:

the dummy column includes first and second ends;

the worst-case dummy bitcell is at the first end; and the dummy sense amplifier is at the second end.

12. The memory device of claim 8, wherein the self-timing circuit further includes a row of dummy bitcells electrically coupled to the dummy word line to simulate a row of the memory array.

13. The memory device of claim 8, wherein the control logic uses the timing control signal to perform at least one of latching the data output from the sense amplifier and shutting down the at least one sense amplifier of the memory core.

14. The memory device of claim 8, wherein the memory cells, worst-case dummy bit cell, and the leakage current simulating dummy bit cells, are selected from the group consisting of single-ended bit cells and dual-ended bit cells.

15. A method for providing leakage current compensation in a self-timing memory circuit comprising:

biasing a worst-case dummy bitcell to drive at least one dummy bit line to a first differential state when a dummy word line is asserted;

biasing a column of leakage current simulating dummy bitcells to delay the driving of the dummy bit line due to leakage current between the leakage current simulating dummy bitcells and the dummy bit line;

detecting the first differential state; and providing a timing control signal for a sense amplification read of a memory core when the first differential state is detected, whereby the timing control signal controls a sense amplification read of a memory core.

16. The method of claim 15, wherein:

the worst-case dummy bitcell stores data relating to a first logic level; and the leakage current simulating dummy bitcells each store data relating to a second logic level that is opposite the first logic level.

17. A computer readable medium comprising a semiconductor memory compiler, the memory compiler comprising instructions which, when executed by a computer, cause the compiler to perform the steps of:

tiling a plurality of memory core cells in the form of an array having a plurality of rows and columns, wherein the memory core cells in each column are coupled to at least one bit line and the memory core cells in each row are coupled to a word line;

connecting each column of memory core cells to at least one sense amplifier that is configured to perform a sense amplification read, wherein the at least one sense amplifier is one of enabled and disabled upon receipt of a timing control signal;

forming a decoding circuit configured to decode an address relating to a particular memory cell, assert the word line corresponding to the particular memory cell, and assert a dummy word line; and forming control logic for controlling the sense amplification read; and forming a self-timing memory circuit including:

a worst-case dummy bitcell electrically coupled to the dummy word line and at least one dummy bit line and configured to drive the dummy bit line to a first differential state when the dummy word line is asserted;

a column of leakage current simulating dummy bitcells each electrically coupled to the dummy bit line and configured to delay the driving of the dummy bit line to the first differential state due to leakage current between the leakage current simulating dummy bitcells and the dummy bit line; and a dummy sense amplifier coupled to the dummy bit line and configured generate the timing control signal when the first differential state is detected, wherein the control logic uses the timing control signal to control the timing of the sense amplification read.

* * * * *